United States Patent
Nielsen et al.

(10) Patent No.: US 9,554,214 B2
(45) Date of Patent: Jan. 24, 2017

(54) SIGNAL PROCESSING PLATFORM IN AN ACOUSTIC CAPTURE DEVICE

(71) Applicant: Knowles Electronics, LLC, Itasca, IL (US)

(72) Inventors: John Nielsen, Hillerod (DK); Anders Svava Mortensen, Koge (DK); Rene Rye Larsen, Bagsvaerd (DK); Robert A. Popper, Lemont, IL (US); Dibyendu Nandy, Naperville, IL (US); Jacob Midtgaard, Fredensborg (DK)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 14/795,305

(22) Filed: Jul. 9, 2015

(65) Prior Publication Data
US 2016/0100257 A1    Apr. 7, 2016

Related U.S. Application Data

(60) Provisional application No. 62/058,975, filed on Oct. 2, 2014.

(51) Int. Cl.
*H04R 1/02*    (2006.01)
*H04R 3/00*    (2006.01)
(Continued)

(52) U.S. Cl.
CPC ............ *H04R 23/00* (2013.01); *H04R 1/04* (2013.01); *B81B 2201/0257* (2013.01);
(Continued)

(58) Field of Classification Search
CPC ......... H04R 19/005; H04R 1/08; H04R 1/406; H04R 1/342; H04R 1/38; H04R 3/00; H04R 3/005; H04R 2201/003; H04R 2201/028; H04R 2201/029; H04R 2201/401; H04R 2201/4034; H04R 23/00; H04R 23/006; H04R 3/007; B81B 2201/0257
(Continued)

(56) References Cited

U.S. PATENT DOCUMENTS 5,592,391 A    1/1997    Muyshondt et al.
5,740,261 A    4/1998    Loeppert
(Continued)

OTHER PUBLICATIONS

International Search Report and Written Opinion for PCT/US2015/051686 dated Dec. 28, 2015 (11 pages).

* cited by examiner

*Primary Examiner* — Xu Mei
(74) *Attorney, Agent, or Firm* — Foley & Lardner LLP

(57) ABSTRACT

A microphone includes a base, a micro electro mechanical system (MEMS) device disposed on the base, and a front end processing apparatus disposed on the base and coupled to the MEMS device, the front end processing apparatus being configured to convert analog signals received from the MEMS device into digital signals. The microphone also includes a DSP apparatus, the DSP apparatus being a digital programmed device with a computer memory, the DSP apparatus configured to process the digital signals received from the front end processing apparatus. The MEMS device, the front end processing apparatus, and DSP apparatus are enclosed within a single microphone enclosure or assembly. During operation the DSP apparatus generates DSP noise. The DSP apparatus includes a noise reduction structure that substantially prevents the DSP noise from reaching or interfering with the operation of the MEMS device or the front end processing apparatus.

18 Claims, 8 Drawing Sheets

(51) Int. Cl.
*H04R 25/00* (2006.01)
*H04R 23/00* (2006.01)
*H04R 1/04* (2006.01)
H04R 19/00 (2006.01)
H04R 1/00 (2006.01)

(52) U.S. Cl.
CPC .............. *H04R 1/005* (2013.01); *H04R 3/007* (2013.01); *H04R 19/005* (2013.01); *H04R 2201/003* (2013.01)

(58) Field of Classification Search
USPC ........ 381/55, 91, 92, 95, 111–114, 122, 173, 381/175, 189, 190, 355, 369, 393, 396; 257/416, 419
See application file for complete search history.

(56) References Cited

U.S. PATENT DOCUMENTS

| | | | |
|---|---|---|---|
| 6,509,640 B1 * | 1/2003 | Li | H01L 23/49822 257/678 |
| 6,535,460 B2 | 3/2003 | Loeppert | |
| 6,552,469 B1 | 4/2003 | Pederson | |
| 6,781,231 B2 | 8/2004 | Minervini | |
| 6,847,090 B2 | 1/2005 | Loeppert | |
| 7,166,910 B2 | 1/2007 | Minervini | |
| 7,190,038 B2 | 3/2007 | Dehe et al. | |
| 7,242,089 B2 | 7/2007 | Minervini | |
| 7,297,567 B2 | 11/2007 | Loeppert | |
| 7,381,589 B2 | 6/2008 | Minervini | |
| 7,382,048 B2 | 6/2008 | Minervini | |
| 7,434,305 B2 | 10/2008 | Minervini | |
| 7,439,616 B2 | 10/2008 | Minervini | |
| 7,473,572 B2 | 1/2009 | Dehe et al. | |
| 7,501,703 B2 | 3/2009 | Minervini | |
| 7,537,964 B2 | 5/2009 | Minervini | |
| 7,633,156 B2 | 12/2009 | Minervini | |
| 7,781,249 B2 | 8/2010 | Laming et al. | |
| 7,795,695 B2 | 9/2010 | Weigold et al. | |
| 7,825,484 B2 | 11/2010 | Martin et al. | |
| 7,829,961 B2 | 11/2010 | Hsiao | |
| 7,856,804 B2 | 12/2010 | Laming et al. | |
| 7,903,831 B2 | 3/2011 | Song | |
| 8,018,049 B2 * | 9/2011 | Minervini | B81B 7/0061 257/704 |
| 8,059,849 B2 * | 11/2011 | Klein | H04R 3/005 381/111 |
| 8,121,331 B2 | 2/2012 | Minervini | |
| 8,126,183 B2 * | 2/2012 | Enstad | H04N 7/142 381/122 |
| 8,170,244 B2 | 5/2012 | Ryan | |
| 8,358,004 B2 | 1/2013 | Minervini | |
| 8,432,007 B2 * | 4/2013 | Leidl | B81B 7/0064 257/416 |
| 8,450,817 B2 | 5/2013 | Minervini | |
| 8,457,332 B2 | 6/2013 | Loeppert | |
| 8,526,665 B2 | 9/2013 | Lutz | |
| 8,594,347 B2 | 11/2013 | Ryan | |
| 8,617,934 B1 | 12/2013 | Minervini | |
| 8,623,709 B1 | 1/2014 | Minervini | |
| 8,623,710 B1 | 1/2014 | Minervini | |
| 8,624,384 B1 | 1/2014 | Minervini | |
| 8,624,385 B1 | 1/2014 | Minervini | |
| 8,624,386 B1 | 1/2014 | Minervini | |
| 8,624,387 B1 | 1/2014 | Minervini | |
| 8,629,005 B1 | 1/2014 | Minervini | |
| 8,629,551 B1 | 1/2014 | Minervini | |
| 8,629,552 B1 | 1/2014 | Minervini | |
| 8,633,064 B1 | 1/2014 | Minervini | |
| 8,649,528 B2 | 2/2014 | Furst et al. | |
| 8,652,883 B1 | 2/2014 | Minervini | |
| 8,704,360 B1 | 4/2014 | Minervini | |
| 8,765,530 B1 | 7/2014 | Minervini | |
| 8,775,172 B2 * | 7/2014 | Konchitsky | G10L 21/0208 381/94.1 |
| 8,781,140 B2 | 7/2014 | Lautenschlager | |
| 8,791,531 B2 | 7/2014 | Loeppert | |
| 8,879,767 B2 | 11/2014 | Wickstrom | |
| 8,969,980 B2 | 3/2015 | Lee | |
| 8,987,030 B2 | 3/2015 | Loeppert | |
| 8,995,694 B2 | 3/2015 | Vos | |
| 9,006,880 B1 | 4/2015 | Minervini | |
| 9,023,689 B1 | 5/2015 | Minervini | |
| 9,024,432 B1 | 5/2015 | Minervini | |
| 9,040,360 B1 | 5/2015 | Minervini | |
| 9,051,171 B1 | 6/2015 | Minervini | |
| 9,061,893 B1 | 6/2015 | Minervini | |
| 9,067,780 B1 * | 6/2015 | Minervini | B81B 7/0061 |
| 9,078,063 B2 | 7/2015 | Loeppert | |
| 9,096,423 B1 | 8/2015 | Minervini | |
| 9,133,020 B1 | 9/2015 | Minervini | |
| 9,137,595 B2 | 9/2015 | Lee | |
| 9,139,421 B1 | 9/2015 | Minervini | |
| 9,139,422 B1 | 9/2015 | Minervini | |
| 9,148,731 B1 | 9/2015 | Minervini | |
| 9,150,409 B1 | 10/2015 | Minervini | |
| 2004/0253760 A1 | 12/2004 | Zhang | |
| 2005/0207605 A1 | 9/2005 | Dehe et al. | |
| 2007/0215962 A1 | 9/2007 | Minervini | |
| 2007/0278501 A1 | 12/2007 | MacPherson et al. | |
| 2008/0037768 A1 | 2/2008 | Hsu et al. | |
| 2008/0142475 A1 | 6/2008 | Loeppert | |
| 2008/0175425 A1 | 7/2008 | Roberts et al. | |
| 2008/0217709 A1 | 9/2008 | Minervini | |
| 2008/0219483 A1 | 9/2008 | Klein et al. | |
| 2008/0267431 A1 | 10/2008 | Leidl et al. | |
| 2008/0279407 A1 | 11/2008 | Pahl | |
| 2008/0283942 A1 | 11/2008 | Huang et al. | |
| 2009/0001553 A1 | 1/2009 | Pahl et al. | |
| 2009/0180655 A1 | 7/2009 | Tien et al. | |
| 2010/0046780 A1 | 2/2010 | Song | |
| 2010/0052082 A1 | 3/2010 | Lee et al. | |
| 2010/0086164 A1 | 4/2010 | Gong et al. | |
| 2010/0128914 A1 | 5/2010 | Khenkin | |
| 2010/0183181 A1 | 7/2010 | Wang | |
| 2010/0246877 A1 | 9/2010 | Wang et al. | |
| 2010/0290644 A1 | 11/2010 | Wu et al. | |
| 2010/0322443 A1 | 12/2010 | Wu et al. | |
| 2010/0322451 A1 | 12/2010 | Wu et al. | |
| 2011/0013787 A1 | 1/2011 | Chang | |
| 2011/0075875 A1 | 3/2011 | Wu et al. | |
| 2012/0039499 A1 | 2/2012 | Ryan | |
| 2013/0108074 A1 | 5/2013 | Reining | |
| 2013/0177192 A1 | 7/2013 | Abry | |
| 2014/0037115 A1 | 2/2014 | Vos | |
| 2014/0037120 A1 | 2/2014 | Lim | |
| 2014/0037124 A1 | 2/2014 | Lim | |
| 2014/0064546 A1 | 3/2014 | Szczech | |
| 2014/0103464 A1 * | 4/2014 | Bolognia | H04R 1/04 257/416 |
| 2014/0133686 A1 | 5/2014 | Lee | |
| 2014/0177113 A1 | 6/2014 | Gueorguiev | |
| 2014/0254837 A1 * | 9/2014 | Mortensen | H03F 3/187 381/120 |
| 2014/0291783 A1 | 10/2014 | Talag | |
| 2014/0291784 A1 | 10/2014 | Conklin | |
| 2014/0294209 A1 | 10/2014 | Szczech | |
| 2014/0321687 A1 | 10/2014 | Friel | |
| 2014/0355784 A1 * | 12/2014 | Han | H04R 1/406 381/92 |
| 2015/0041929 A1 * | 2/2015 | Bolognia | H04R 25/604 257/416 |
| 2015/0049884 A1 | 2/2015 | Ye | |
| 2015/0110284 A1 * | 4/2015 | Niemisto | G10L 21/0208 381/71.1 |
| 2015/0117681 A1 | 4/2015 | Watson | |
| 2015/0131820 A1 * | 5/2015 | Veneri | H04R 23/00 381/174 |
| 2015/0139428 A1 | 5/2015 | Reining | |
| 2015/0166335 A1 | 6/2015 | Loeppert | |
| 2015/0172825 A1 | 6/2015 | Lim | |

(56) References Cited

U.S. PATENT DOCUMENTS

2015/0195659 A1 7/2015 Szczech
2015/0208165 A1 7/2015 Volk
2015/0251898 A1 9/2015 Vos

SIGNAL PROCESSING PLATFORM IN AN ACOUSTIC CAPTURE DEVICE

CROSS REFERENCE TO RELATED APPLICATION

This patent claims benefit under 35 U.S.C. §119(e) to U.S. Provisional Application No. 62/058,975 entitled "Signal Processing Platform in Acoustic Capture Device" filed Oct. 2, 2014, the content of which is incorporated herein by reference in its entirety.

TECHNICAL FIELD

This application relates to acoustic devices and, more specifically, to the types of functionality provided by and configuration of these devices.

BACKGROUND OF THE INVENTION

A microphone is an acoustic transducer converting sound pressure signals to equivalent electrical signals. This electrical equivalent of the sound is generally used in bidirectional telecommunications or for later playback. Historically, this acoustic capture has been done completely in the analog domain. The improvement of audio capture technology has led to digital microphones, particularly microphones that output pulse density modulated (PDM) digital signals.

Processing of the captured audio signals to improve or enhance the desired signal is used with bi-directional telecommunications and recording. This aspect of audio signal enhancement supports new use cases in particular to meet demands of compact size, ease of integration and increasing needs to operate in noisy conditions while still providing quality audio with reduced noise.

Such signal processing is usually conducted by a combination of a codec and a digital signal processor (DSP) engine, wherein the DSP functionality may be embedded in the codec hardware or is implemented in hardware external to the codec and is supplied by data from the codec. Furthermore, such processed data is then provided to the consuming application that runs on the same or another processor to facilitate a recording or telecommunication objective.

Previous approaches include multiple intermediate processing integrated circuit chips, which increases the complexity, size, and power requirements of the approach. By "chip" and as used herein, it is meant a piece of silicon. These previous approaches also increase the cost of the system. All of these problems have resulted in some user dissatisfaction with previous approaches.

BRIEF DESCRIPTION OF THE DRAWINGS

For a more complete understanding of the disclosure, reference should be made to the following detailed description and accompanying drawings wherein.

Figure 1:
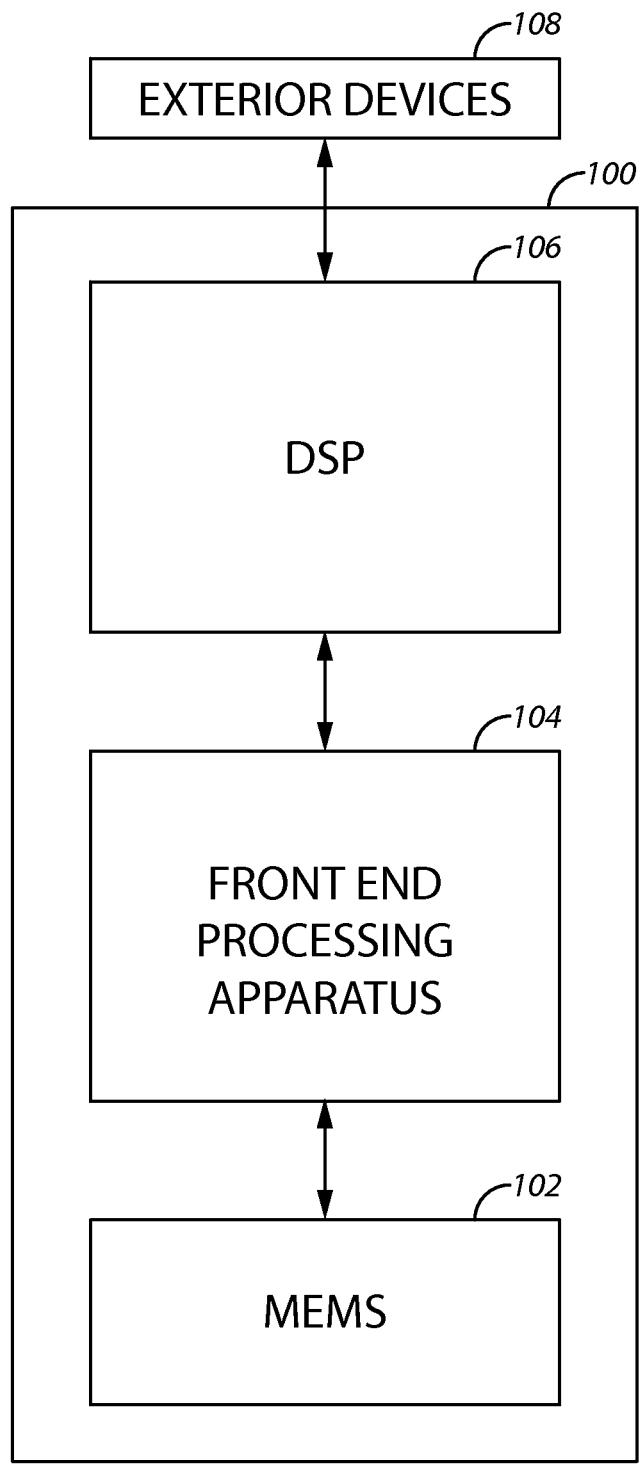
FIG. 1 comprises a block diagram of a microphone according to various embodiments of the present invention.

Skilled artisans will appreciate that elements in the figures are illustrated for simplicity and clarity. It will further be appreciated that certain actions and/or steps may be described or depicted in a particular order of occurrence while those skilled in the art will understand that such specificity with respect to sequence is not actually required. It will also be understood that the terms and expressions used herein have the ordinary meaning as is accorded to such terms and expressions with respect to their corresponding respective areas of inquiry and study except where specific meanings have otherwise been set forth herein.

DETAILED DESCRIPTION

In the approaches presented herein, disparate functionalities are combined into a single microphone assembly, housing, or package. In one aspect, the signal processing path is optimized by reducing the number of intermediate processing integrated circuit chips and providing enhanced functionality within a single microphone package, assembly, or housing. Although the approaches presented herein are described with respect their usage with microphones, it will be understood that these approaches can also be deployed in any type of sensing environment or be used with any type of sensor.

In one advantage obtained by the approaches presented herein, a low power signal processing engine is provided in a single microphone assembly. Various functionalities are provided in a compact processing platform within a small package, thereby reducing the number of system pin connects. The cost and system power requirements of such signal processing capabilities are optimized by eliminating or reducing a number of intermediate devices that serve the application.

In many of these embodiments, a microphone assembly includes a base and a cover. On the base is disposed a MEMS device, a digital signal processing (DSP) chip, and at least one other chip that includes an analog interface.

In some aspects, the microphone assembly includes a random access memory (RAM). In other aspects, the microphone assembly includes a read only memory (ROM). Various combinations of ROM and RAM may also be used. The memory structure may be distributed with a part disposed on a DSP chip and the remaining part disposed on another chip having an analog interface, or with the memory in whole or in part on a separate memory chip.

Various shielding approaches are provided to isolate noise produced by the DSP chip from other components. In some examples, a shield is put over, under or around the DSP chip. The shield prevents at least some electrical noise originating from the DSP chip from interfering with the operation of other electrical components such as the MEMS device.

In other examples, a Faraday cage is utilized for noise isolation. The Faraday cage is connected to a low noise ground which is separate from the DSP ground. The Faraday cage can be implemented around the DSP, depending on the isolation needed.

As used herein, a low noise ground (also referred to as analog ground herein) is understood as a "quiet" ground typically connected to analog components sensitive to noise. By the term "DSP ground" (also referred to digital ground herein), it is meant as a ground that is connected to digital components. Further, as used herein, a Faraday cage is understood as an electrically conductive enclosure which will shield from electromagnetic or electrostatic coupling between the interior and exterior of the cage, as long as any holes in the electrically conductive material comprising the Faraday cage are significantly smaller than both the wavelength of any relevant electromagnetic radiation being generated on either side of the cage and the distance between the cage and any components on either side of the cage which may couple electrostatically.

It will be appreciated that the structures utilized herein create electrical isolation between sections of the DSP chip. For instance, a full shield may be created around the DSP apparatus on the DSP chip and further isolates sensitive components such as the MEMS device from noise produced by the DSP chip.

The Faraday cage can be constructed in a variety of ways. For example, the Faraday cage may be constructed using doped wells in the silicon substrate, a metal piece on top of the chip, and vias connecting the top-metal to the silicon substrate. Maximum coverage is provided with minimum openings provided that allow signals to get in and out of the DSP, and with the vias connecting metal and substrate all around the perimeter of the DSP to shield the side walls.

In other aspects of utilizing a Faraday cage, a shield is used with the DSP chip and two ground connections are used. In this case, the DSP apparatus is disposed in a well portion of the chip that is oppositely doped compared to the doping in the silicon substrate area of the chip surrounding the well portion. For example and in one aspect, in an n-well process utilizing a p-doped silicon substrate, the active circuitry of the DSP, may be placed inside a deep n-doped well in effect isolating the silicon substrate from at least some noise.

Further, the p-doped substrate, in which the deep n-well is located, the top metal of the chip which should not contain any signals and should have the maximum metal coverage allowed by the process and the vias connecting top metal and silicon substrate all around the perimeter of the DSP apparatus, should be connected to the "quieter" low noise ground separate from the DSP ground. Thus, a Faraday cage is created which isolates the other chips from noise arising from the DSP chip. Example Faraday cage structures are described in greater detail elsewhere herein.

In some aspects, the DSP apparatus analog interface and other functionality are integrated in a single chip. In other examples, the DSP chip and the at least one chip are disposed side-by-side or are otherwise adjacent to each other.

In some examples, the DSP chip is disposed on top of a chip that includes the analog interface. In other examples, a flip chip approach is used to couple a chip having the DSP with a chip that has the analog interface.

In many of these embodiments, a microphone includes a base, a micro electro mechanical system (MEMS) device disposed on the base, and a front end processing apparatus disposed on the base and coupled to the MEMS device, the front end processing apparatus being configured to convert analog signals received from the MEMS device into digital signals. The microphone also includes a DSP apparatus, the DSP apparatus being a digital programmed device with a computer memory, the DSP apparatus configured to process the digital signals received from the front end processing apparatus. The MEMS device, the front end processing apparatus, and DSP apparatus are enclosed within a single microphone enclosure or assembly. During operation the DSP apparatus generates DSP noise. The DSP apparatus includes a noise reduction structure that substantially prevents the DSP noise from reaching or interfering with the operation of the MEMS device or the front end processing apparatus.

In other aspects, a chip is disposed on the base and coupled to the MEMS device, and the DSP apparatus and the front end processing apparatus are disposed at the chip. In other examples a first chip and a second chip are disposed on the base and coupled to the MEMS device, and the DSP apparatus is disposed at the first chip and the front end processing apparatus is disposed at the second chip. In some aspects, first chip is disposed on top of the second chip.

In some examples, the noise reduction structure comprises a Faraday cage. In other examples, the DSP apparatus is constructed of different layers, and the noise reduction apparatus is connected to a low noise ground, and the DSP apparatus further comprises digital components, the digital components being coupled to a digital ground.

In still other aspects, the DSP apparatus has multiple layers of materials including a top layer and the noise reduction apparatus is disposed above the top layer.

In others of these embodiments, a microphone includes a base; a micro electro mechanical system (MEMS) device disposed on the base; and a front end processing apparatus disposed on the base and coupled to the MEMS device. The front end processing apparatus is configured to convert analog signals received from the MEMS device into digital signals. A DSP apparatus is coupled to the front end processing apparatus, the DSP apparatus being a digital programmed device with a computer memory. The DSP apparatus is configured to process the digital signals received from the front end processing apparatus. The MEMS device, the front end processing apparatus, and DSP apparatus are enclosed within a single microphone enclosure or assembly. During operation, the DSP apparatus generates DSP noise. The DSP apparatus includes a shield disposed at a top portion of the DSP apparatus that is configured to substantially prevent the DSP noise from reaching or interfering with the operation of the MEMS device or the front end processing apparatus. The DSP apparatus is constructed of different layers, and the noise reduction apparatus is connected to a low noise ground. The DSP apparatus further comprises digital components, the digital components being coupled to a digital ground.

Referring now to FIG. 1, one example of a microphone 100 is described. The microphone includes a MEMS device 102, a front end processing apparatus 104, and a digital signal processor (DSP) 106. The DSP 106 couples to exterior devices 108.

The MEMS device 102 is a device that converts sound energy into an analog electrical signal. The MEMS device 102 may include a diaphragm and a back plate. Sound energy moves the diaphragm and creates a changing electrical potential with the back plate to create the analog electrical signal.

The front end processing apparatus 104 includes an interface to the MEMS device 102. Additionally, the front end processing apparatus may include a preamplifier and a charge pump, an analog-to-digital converter (to convert the analog signals received from the MEMS device 102 into digital signals), and an interface to the DSP 106. Other functions may also be performed by the front end processing apparatus 104. Within the front end processing apparatus 104, these functions can be grouped into an analog MEMS interface, specific analog circuitry for analog signal processing, digital conversion circuitry, specific digital logic circuitry to further process the signal digitally, random access memory (RAM) and/or other types of memory and a digital interface.

The DSP 106 may be programmed to perform any digital signal processing function on the received digital signal. The DSP 106 includes an interface to the front end, an interface to the external devices 108, and memory (e.g., random access memory). Other examples of functionality may also be included. The DSP 106 may include a random access memory (RAM). In other aspects, the DSP 106 includes a read only memory (ROM). Various combinations of RAM and ROM may also be used. Consequently, the microphone 100 may now include within its housing a memory device.

The exterior devices 108 may receive the signal from the DSP 106 and perform other processing functions. In these regards, the exterior devices 108 may be devices situated at a customer device such as a cellular phone, personal computer, or tablet. Other examples of customer devices are possible.

It will be appreciated that the above-mentioned components are included within a single housing or assembly. In one aspect, the front end processing apparatus 104 and the DSP are disposed on the same chip within the single microphone housing or assembly. In another aspect, the front end processing apparatus 104 and the DSP are disposed on different chips within the microphone housing or assembly.

In another example, the chip including the DSP 106 may be disposed above the chip with the front end processing apparatus 104. That is, the chip including the DSP 106 generally may reside in a first plane and the chip with the front end processing apparatus 104 may be disposed in a second plane. The two chips may be disposed in a vertical direction so that the two planes run generally parallel to each other.

In one approach, a shield (or other shielding structure or approaches) may be coupled to, disposed on, formed with, or otherwise associated with the DSP 106 to prevent noise from the DSP from interfering with the operation of other devices in the system such as the MEMS device 102. In one aspect, the shield is formed from a p-substrate and metal structures. Other examples of materials may also be used to construct the shield.

In yet other aspects, when the DSP chip is on top of the front end processing apparatus chip, the chips may couple together with a flip chip approach as described elsewhere herein.

Figure 2:
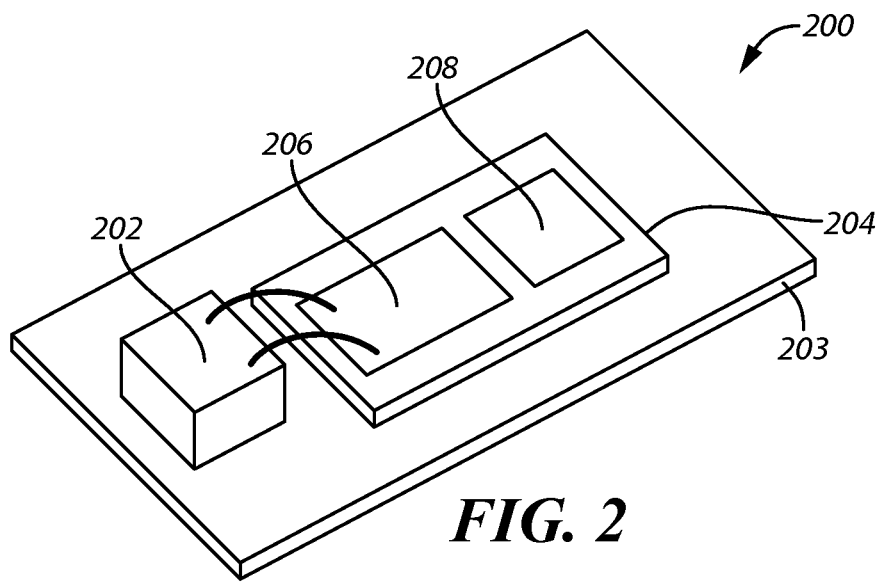
FIG. 2 comprises a perspective view of a microphone assembly according to various embodiments of the present invention.

Referring now to FIG. 2, one example of a microphone assembly 200 is described. The microphone assembly includes a MEMS device 202, and a chip 204, which includes the front end processing apparatus 206 as described above and a DSP apparatus 208. All of these components are disposed on a base 203. The MEMS device 202 is coupled to the chip 204. A cover (not shown) encloses these components. Consequently, the MEMS device 202, the front end processing apparatus 206, and the DSP 208 are disposed within a single microphone assembly or housing.

Figure 3:
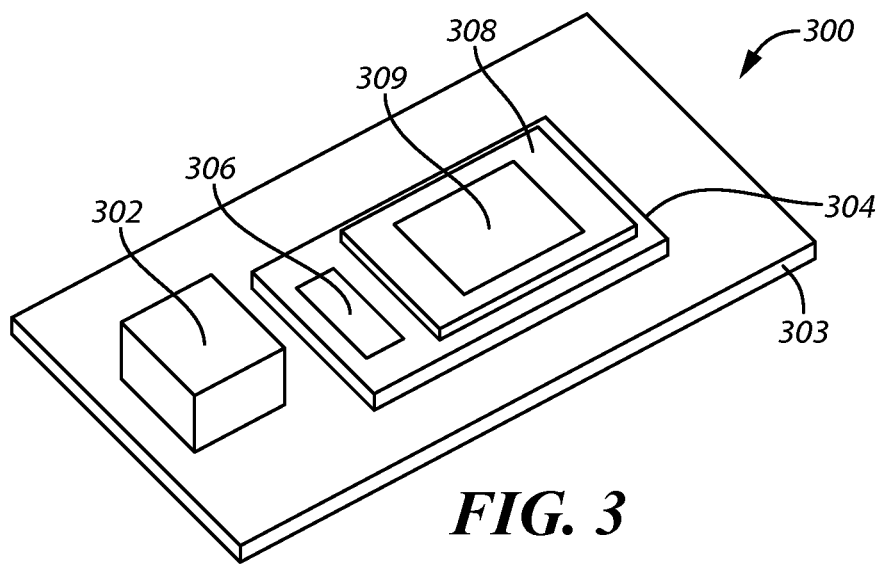
FIG. 3 comprises a perspective view of another microphone assembly according to various embodiments of the present invention.

Referring now to FIG. 3, another example of a microphone assembly 300 is described. The microphone assembly includes a MEMS device 302, and a first chip 304, which includes the front end processing apparatus 306 as described above and, and a DSP chip 308 including DSP apparatus 309. All of these components are disposed on a base 303. The MEMS device 302 is coupled to the chip 304. A cover (not shown) encloses these components. Consequently, the MEMS device 302, the front end processing apparatus 306, and the DSP chip 308 are disposed within a single microphone assembly or housing.

In this example, the DSP chip 308 is disposed above (on top of) the first chip 304. Electrical connections between the two chips may be provided by wires or by using a flip-chip approach. It will be appreciated that the relative disposition of the two chips in FIG. 3 is one example, and that other configurations are possible.

Figure 4:
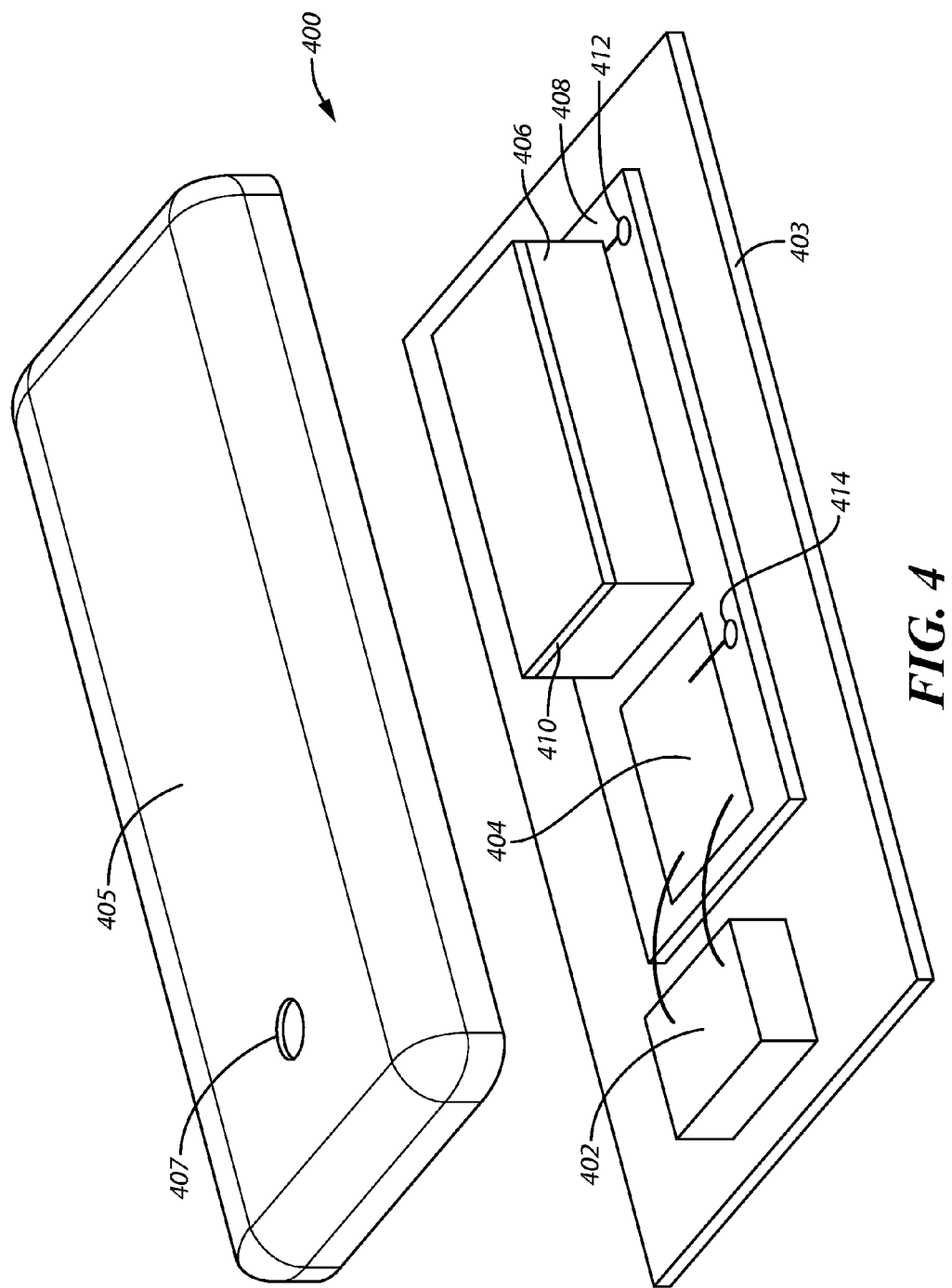
FIG. 4 comprises a perspective view of a microphone assembly using a shield according to various embodiments of the present invention.

Referring now to FIG. 4, one example of shielding using a shield, and analog and DSP grounds is described. The microphone assemblies described herein are provided with a low noise ground and a DSP ground. As mentioned above, a low noise (or analog) ground as referred to in this context is understood as a "quiet" ground typically connected to analog components sensitive to noise. A DSP ground as referred to herein is meant as a ground that is connected to digital components.

Generally speaking, the DSP ground is noisier than the low noise ground. In some aspects, the low noise ground is referred to as a silent ground because its noise level is zero or essentially zero.

As shown, in FIG. 4, a microphone 400 includes a MEMS device 402. A front end apparatus 404 (including an analog interface) and a DSP 406 are disposed on a chip 408. The DSP 406 is noisy so there was a disincentive in previous approaches of putting any DSP into the same assembly as the other microphone components.

Here, the DSP 406 may be constructed of multiple layers of material. In one aspect a shield 410 is disposed on top of the DSP 406 and connected to low noise ground 412. The digital components (e.g., digital components in the front end apparatus 404) may be coupled to a DSP ground 414. This configuration reduces the amount of noise that can travel from the DSP 406 to the MEMS device 402 and the chip 408. The chip 408 and MEMS device 402 are disposed on a base 403. A cover 405 couples to the base 403 and encloses the components. A port 407 in the cover allows sound energy to enter the microphone 400.

Figure 5:
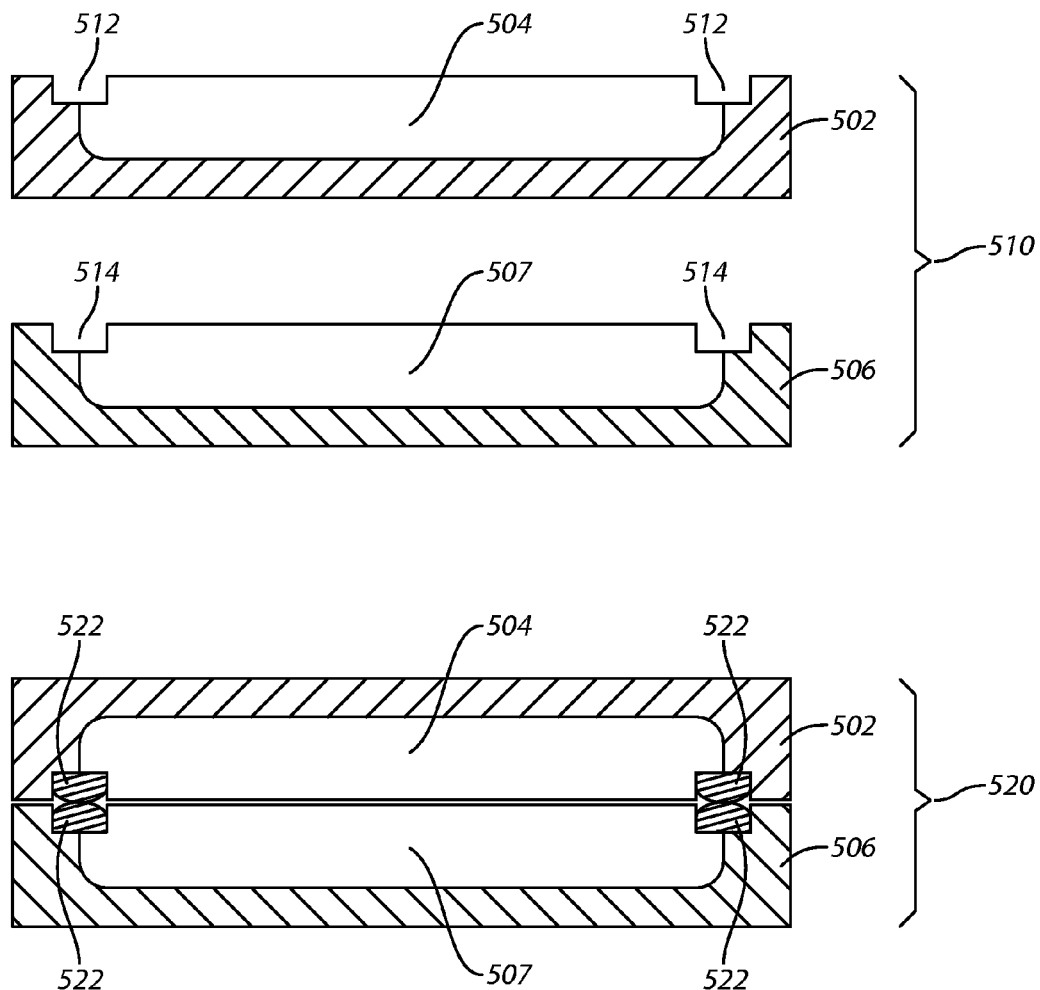
FIG. 5 comprises cross-sectional diagrams of chips used in a microphone assembly being coupled together using a flip-chip approach according to various embodiments of the present invention.

Referring now to FIG. 5, one example of using a flip-chip design with the present approaches is described. A first chip 502 includes a DSP 504. A second chip 506 includes a front end processing apparatus 507. The chips are initially disposed in a first position 510. First holes or openings 512 are formed in the first chip 502 and second holes or openings 514 are formed in the second chip 506. In one aspect, wires can be soldered to the holes 512, 514 to make electrical connections with other components.

However and as shown in position 520, in the flip chip design, the holes are filled with a solder (e.g., gold), and the first chip is flipped over as shown. The holes 514 in the bottom chip 506 align with the holes 512 in the top chip (now filled with solder 522). Because the holes 512, 514 are aligned, electrical connections are provided between the two chips 502 and 506.

It will be appreciated that the flip-chip connection approach described in FIG. 5 eliminates the need for separate wires between the two chips 502 and 506. Additionally, this approach also reduces the height of the microphone assembly. It will be understood that this approach can be used in any of the examples described herein to couple two separate chips together, and that other flip-chip connection approaches and materials may be used, e.g. deposition of solder material on only one of the chips, use of e.g. heat or vibration to achieve bonding or electrically conductive glue.

Figure 6:
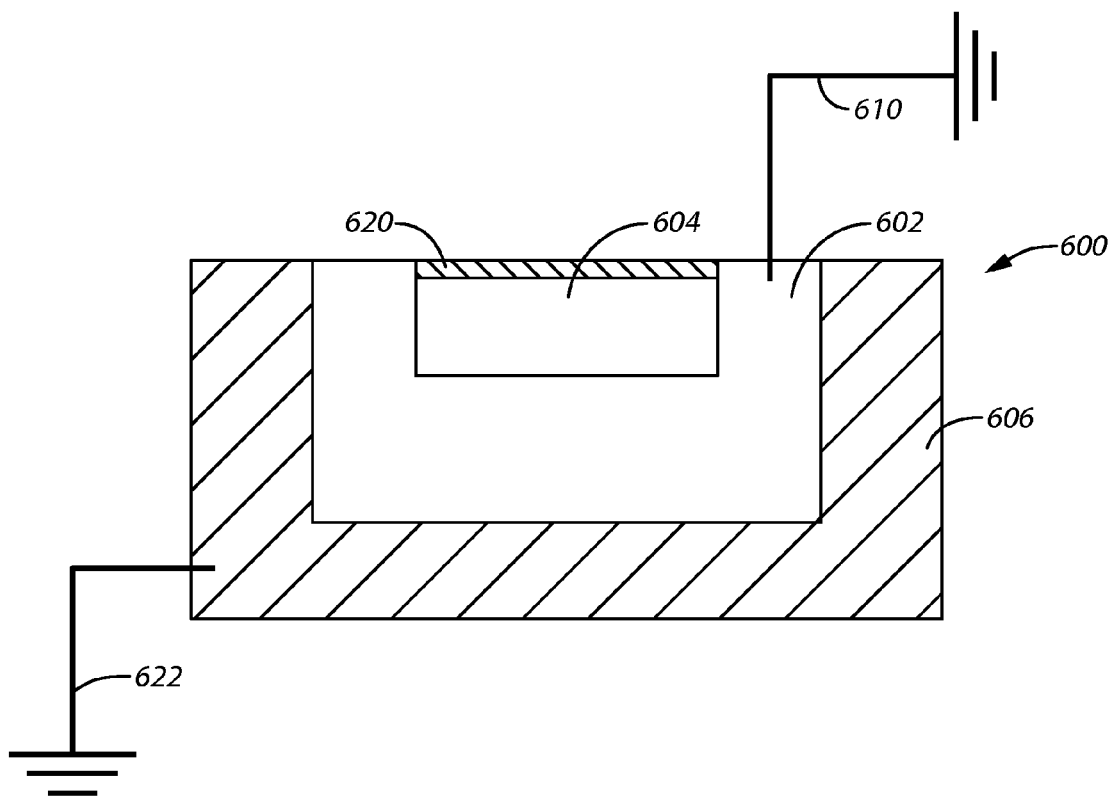
FIG. 6 comprises a cross-sectional view showing a noise reduction structure according to various embodiments of the present invention.

Referring now to FIG. 6, isolation approaches for chips in a microphone assembly are described. A chip 600 includes a lightly doped well region 602 and a more heavily doped outer region 606. The well region 602 has DSP processing component 604 (e.g., transistors, switches, and other devices).

The well region 602 is connected to a DSP ground 610. The outer region 606 is connected to low noise ground 622. A shield 620 may be disposed on the top of the DSP processing component 604 or across the entire top of the chip 600. This structure creates a full shield around the DSP and further isolates sensitive components such as the MEMS device from noise.

Figure 7A:
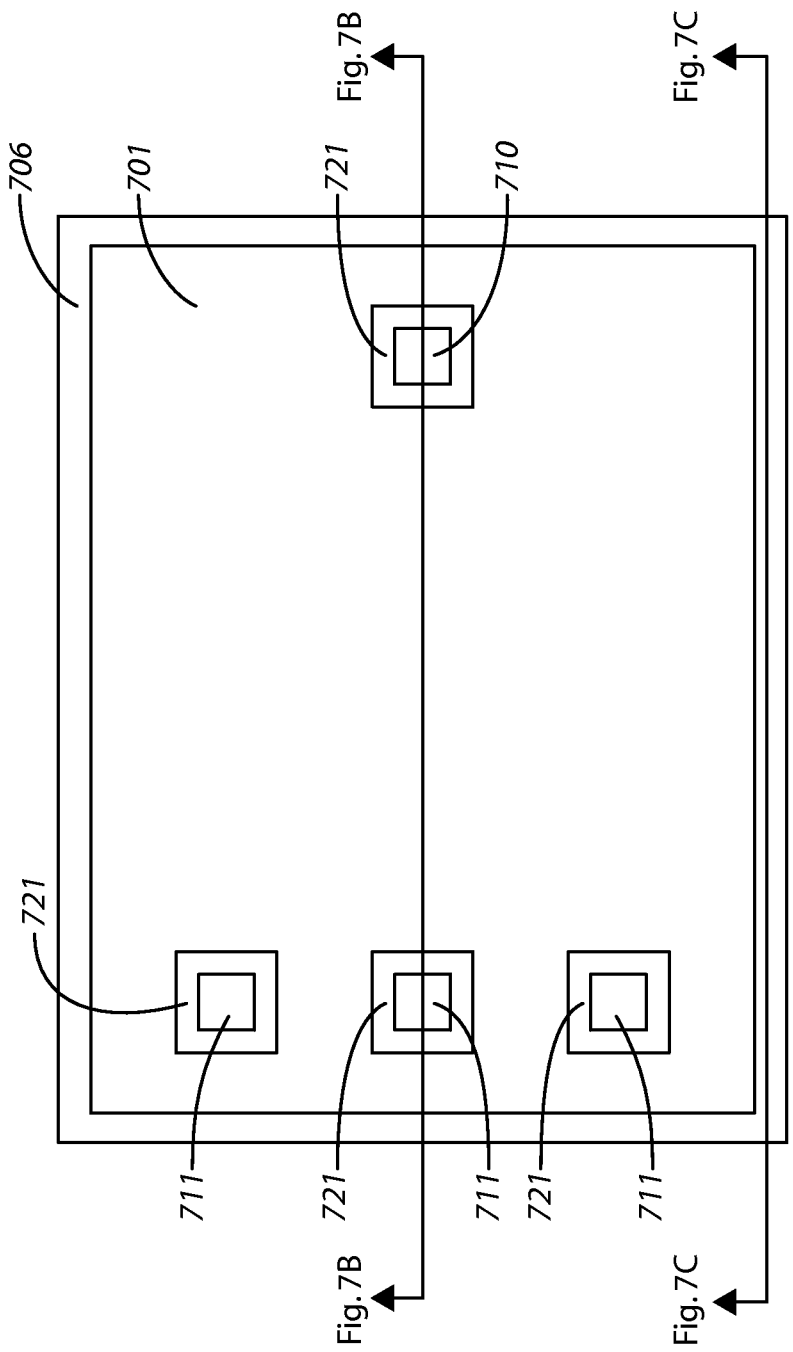
FIGS. 7A-C comprise a top view and cross-sectional views showing an example of a Faraday cage on a chip according to various embodiments of the present invention.
Figure 7B:
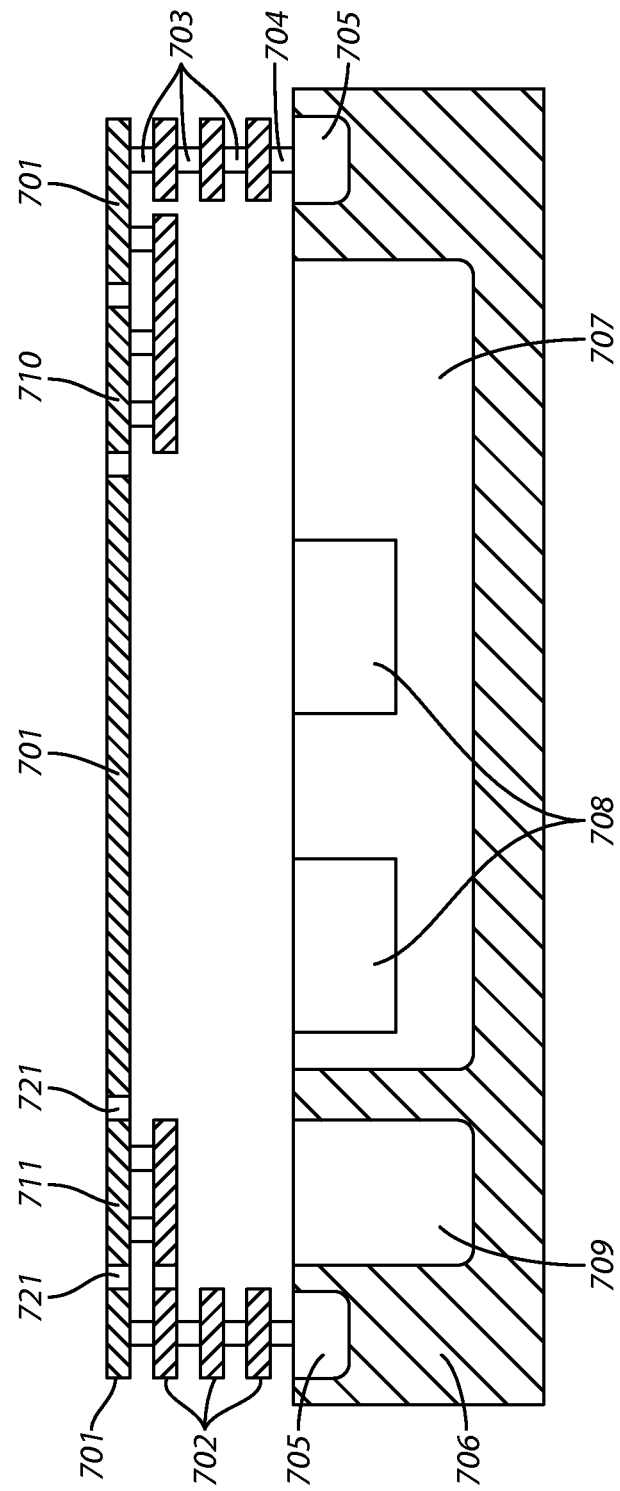
Figure 7C:
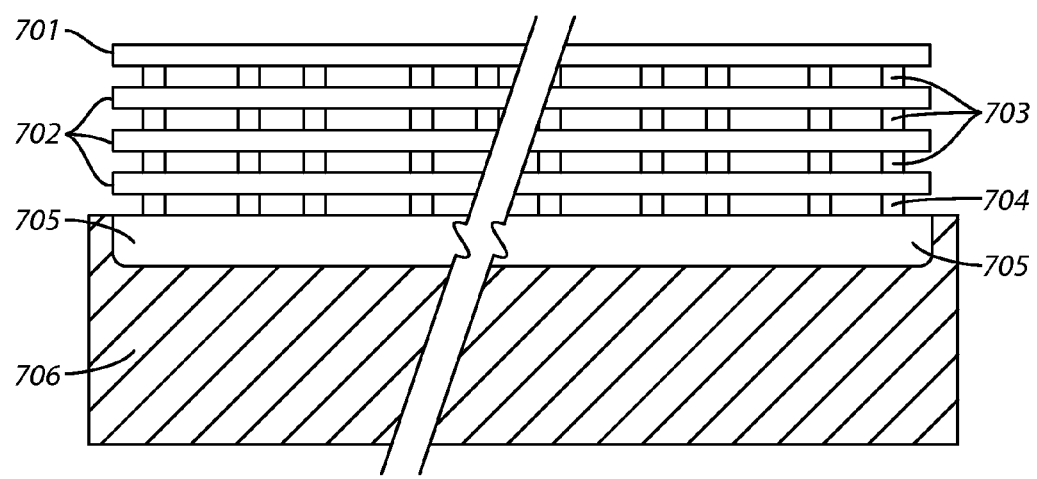

Referring now to FIGS. 7A-C an embodiment of the Faraday cage is described. FIG. 7A shows a top view of the chip containing the DSP apparatus. A top most metal layer 701 is disposed with openings only as required to access signals and supplying power to the circuits in the chip, and as required by manufacturing metal density rules. The metal layer 701 is the metal shield. Metal pads 711 are used to couple to signals and power, and are isolated from the metal layer/shield 701 by a small gap 721. Pad 710 is used to connect low noise ground to the Faraday cage and may also have a gap 721 to the surrounding shield 701 and be connected at a lower metal level if required by manufacturing rules, but may also be connected directly in the top most metal layer 701.

FIG. 7B represents a cross-section view of the chip. The top most metal layer 701 is connected around the periphery through vias 703, intermediate metal layers 702, contacts 704 and p-doped portions of the silicon substrate 705 to the lightly p-doped silicon substrate 706 effectively enclosing the interior of the chip in an electrically connected Faraday cage.

Within the substrate and metal cage the circuits of the DSP apparatus are placed in a deep n-doped well 707 effectively isolating the n- and p-doped wells 708 of the DSP circuits from the silicon substrate. Other circuits requiring isolation from the DSP apparatus may be placed in separate deep n-doped wells 709.

FIG. 7C represents a side view of the chip showing how top metal 701, vias 703, intermediate metal layers 702, contacts 704, p-doping portion of the silicon substrate 705 and silicon substrate 706 effectively create an electrically connected shield with only small dimension openings between metal layers, vias, contacts and substrate. These openings can be minimized to create an effective Faraday cage at the relevant frequencies and distances.

Preferred embodiments of this invention are described herein, including the best mode known to the inventors for carrying out the invention. It should be understood that the illustrated embodiments are exemplary only, and should not be taken as limiting the scope of the invention.

What is claimed is:

1. A microphone, the microphone comprising:
   a base;
   a micro electro mechanical system (MEMS) device disposed on the base;
   a front end processing apparatus disposed on the base and coupled to the MEMS device, the front end processing apparatus configured to convert analog signals received from the MEMS device into digital signals; and
   a DSP apparatus coupled to the front end processing apparatus, the DSP apparatus being a digital programmed device with a computer memory, the DSP apparatus configured to process the digital signals received from the front end processing apparatus,
   wherein the MEMS device, the front end processing apparatus, and DSP apparatus are enclosed within a single microphone enclosure or assembly,
   wherein during operation the DSP apparatus generates DSP noise,
   wherein the DSP apparatus includes a noise reduction structure that reduce an amount of the generated DSP noise from reaching or interfering with the operation of the MEMS device or the front end processing apparatus, and
   wherein the DSP apparatus has multiple layers of materials including a top layer and the noise reduction apparatus is disposed above the top layer.

2. The microphone of claim 1, further comprising a chip disposed on the base and coupled to the MEMS device, and the DSP apparatus and the front end processing apparatus being disposed at the chip.

3. The microphone of claim 1, further comprising a first chip and a second chip, the first chip and the second chip being disposed on the base and coupled to the MEMS device, and the DSP apparatus disposed at the first chip and the front end processing apparatus being disposed at the second chip.

4. The microphone of claim 3, wherein first chip is disposed on top of the second chip.

5. The microphone of claim 1, wherein the noise reduction structure comprises a Faraday cage.

6. The microphone of claim 1, wherein the noise reduction apparatus is connected to a low noise ground, and wherein the DSP apparatus further comprises digital components, the digital components being coupled to a digital ground.

7. The microphone of claim 1, further comprising a cover configured to cover the MEMS device and the DSP apparatus.

8. A microphone, the microphone comprising:
   a base;
   a micro electro mechanical system (MEMS) device disposed on the base;
   a front end processing apparatus disposed on the base and coupled to the MEMS device, the front end processing apparatus configured to convert analog signals received from the MEMS device into digital signals; and
   a DSP apparatus coupled to the front end processing apparatus, the DSP apparatus being a digital programmed device with a computer memory, the DSP apparatus configured to process the digital signals received from the front end processing apparatus,
   wherein the MEMS device, the front end processing apparatus, and DSP apparatus are enclosed within a single microphone enclosure or assembly,
   wherein during operation the DSP apparatus generates DSP noise,
   wherein the DSP apparatus includes multiple layers including a top layer, and a shield disposed above the top layer of the DSP apparatus and is configured to reduce the amount of the generated DSP noise from reaching or interfering with the operation of the MEMS device or the front end processing apparatus, and
   wherein the DSP apparatus is constructed of different layers, and wherein the shield is connected to a low noise ground, and wherein the DSP apparatus further comprises digital components, the digital components being coupled to a digital ground.

wherein the DSP apparatus is constructed of different layers, and wherein the noise reduction apparatus is connected to a low noise ground, and wherein the DSP apparatus further comprises digital components, the digital components being coupled to a digital ground.

9. The microphone of claim 8, further comprising a chip disposed on the base and coupled to the MEMS device, and the DSP apparatus and the front end processing apparatus being disposed at the chip.

10. The microphone of claim 8, further comprising a first chip and a second chip, the first chip and the second chip being disposed on the base and coupled to the MEMS device, and the DSP apparatus disposed at the first chip and the front end processing apparatus being disposed at the second chip.

11. The microphone of claim 10, wherein first chip is disposed on top of the second chip.

12. The microphone of claim 10, further comprising a cover that covers the MEMS device and the DSP apparatus.

13. The microphone of claim 8, wherein the noise reduction structure comprises a Faraday cage.

14. A microphone, the microphone comprising:
a base;
a micro electro mechanical system (MEMS) device disposed on the base;
a front end processing apparatus disposed on the base and coupled to the MEMS device, the front end processing apparatus configured to convert analog signals received from the MEMS device into digital signals;
a DSP apparatus coupled to the front end processing apparatus, the DSP apparatus being a digital programmed device with a computer memory, the DSP apparatus configured to process the digital signals received from the front end processing apparatus;
wherein the MEMS device, the front end processing apparatus, and DSP apparatus are enclosed within a single microphone enclosure or assembly;
wherein during operation the DSP apparatus generates DSP noise;
wherein the DSP apparatus includes a Faraday cage, at least a portion of which is disposed above a top layer of the DSP apparatus and is configured to reduce an amount of the generated DSP noise from reaching or interfering with the operation of the MEMS device or the front end processing apparatus;
wherein the DSP apparatus is constructed of different layers, and wherein the Faraday cage is connected to a low noise ground, and wherein the DSP apparatus further comprises digital components, the digital components being coupled to a digital ground.

15. The microphone of claim 14, further comprising a chip disposed on the base and coupled to the MEMS device, and the DSP apparatus and the front end processing apparatus being disposed at the chip.

16. The microphone of claim 14, further comprising a first chip and a second chip, the first chip and the second chip being disposed on the base and coupled to the MEMS device, and the DSP apparatus disposed at the first chip and the front end processing apparatus being disposed at the second chip.

17. The microphone of claim 16, wherein first chip is disposed on top of the second chip.

18. The microphone of claim 16, further comprising a cover that covers the MEMS device and the DSP apparatus.

* * * * *